United States Patent
Chou (10) Patent No.: US 8,222,528 B2
(45) Date of Patent: Jul. 17, 2012

(54) CIRCUIT BOARD STRUCTURE FOR ELECTRICAL TESTING AND FABRICATION METHOD THEREOF

(75) Inventor: Pao-Hung Chou, Hsin-Chu (TW)

(73) Assignee: Unimicron Technology Corp., Taoyuan (TW)

( * ) Notice: Subject to any disclaimer, the term of this patent is extended or adjusted under 35 U.S.C. 154(b) by 1164 days.

(21) Appl. No.: 12/045,140

(22) Filed: Mar. 10, 2008

(65) Prior Publication Data
US 2008/0185177 A1      Aug. 7, 2008

(51) Int. Cl.
*H05K 1/03* (2006.01)
(52) U.S. Cl. .......................... 174/255; 174/262
(58) Field of Classification Search .............. 174/254, 174/255, 261, 260, 262
See application file for complete search history.

(56) References Cited

U.S. PATENT DOCUMENTS

| | | | |
|---|---|---|---|
| 6,462,283 B1 * | 10/2002 | Hirai et al. .................... | 174/260 |
| 6,660,559 B1 | 12/2003 | Huemoeller et al. | |
| 7,384,566 B2 * | 6/2008 | Chen et al. .................... | 216/13 |
| 7,402,755 B2 * | 7/2008 | Chen et al. .................... | 174/250 |
| 2003/0137035 A1 * | 7/2003 | Huang et al. .................. | 257/668 |
| 2007/0243666 A1 * | 10/2007 | Huang et al. .................. | 438/127 |

* cited by examiner

Primary Examiner — Ishwarbhai Patel
(74) Attorney, Agent, or Firm — Schmeiser, Olsen & Watts LLP (57) ABSTRACT

The invention provides a circuit board structure for electrical testing and a fabrication method thereof. The circuit board structure includes: a core board having a plurality of first circuits, an electroplating conductive wires, and distributing wires for electrical connection thereof; a dielectric layer formed on the core board, the first circuits, the distributing wires and the electroplating conductive wires, wherein the dielectric layer is formed with at least one opening for exposing the distributing wires; a plurality of second circuit formed on the dielectric layer and electrically connected to the first circuits; a solder mask layer formed on the dielectric layer and the second circuits; and at least one first opening formed in the solder mask layer, above the distributing wires, and deep into the dielectric layer to create a broken circuit between the distributing wires and the electroplating conductive wires, thus enabling electrical testing of the circuit board structure, and reducing noise interference.

8 Claims, 10 Drawing Sheets

CIRCUIT BOARD STRUCTURE FOR ELECTRICAL TESTING AND FABRICATION METHOD THEREOF

BACKGROUND OF THE INVENTION

1. Field of the Invention

The present invention relates generally to a circuit board structure for electrical testing and a fabrication method thereof, and more particularly to a circuit board structure and fabrication method thereof, wherein distributing wires and a plurality of electroplating conductive wires are disposed in the inner layer of the circuit board structure, and a broken circuit is created in the distributing wires, so as to perform electrical testing.

2. Description of Related Art

The electroplating conductive wire of a multi-layered CSP (Chip Size Package) product is generally formed in the inner layer core board of the product so as to ensure high reliability of the circuit board. Before electrical testing of the circuit board can be performed, the electroplating conductive wire in the inner layer core board must be removed or severed.

Referring to FIG. 1 and FIGS. 2A to 2E, schematic views illustrate a conventional method of breaking individual circuits in order to provide separate circuits.

Figure 1:
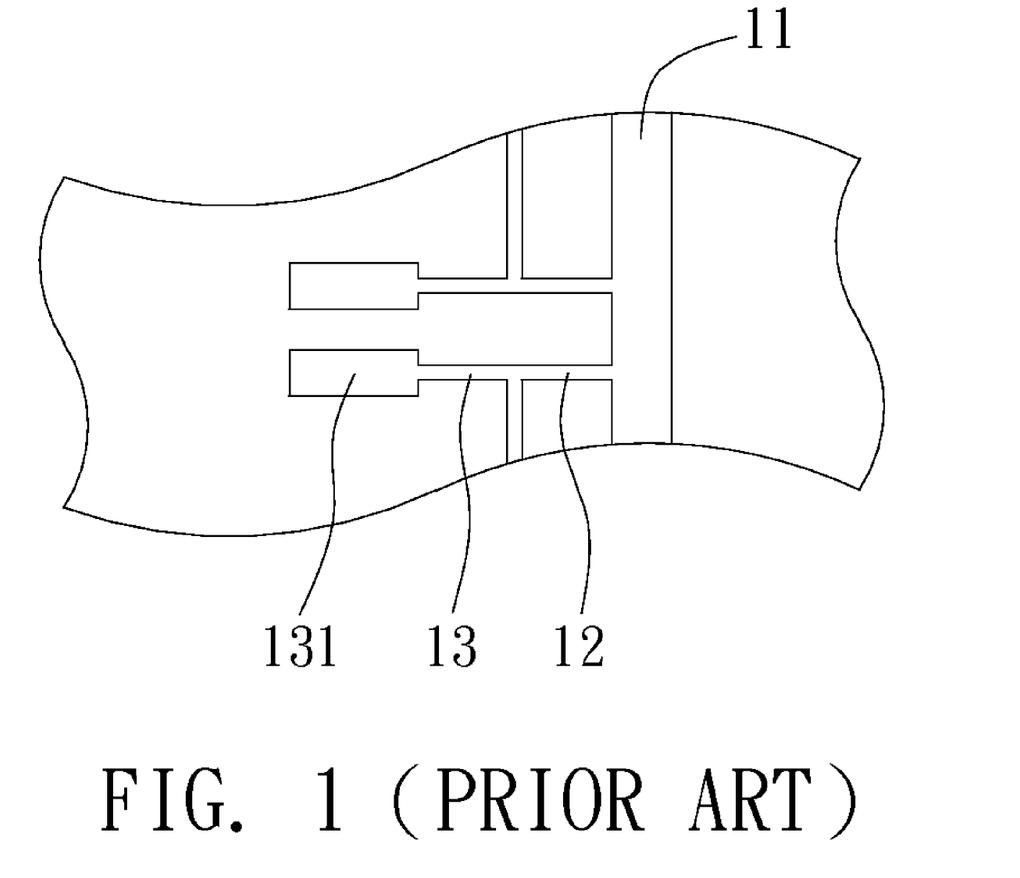
FIG. 1 is a local top view of a conventional circuit board.
Figure 2A:
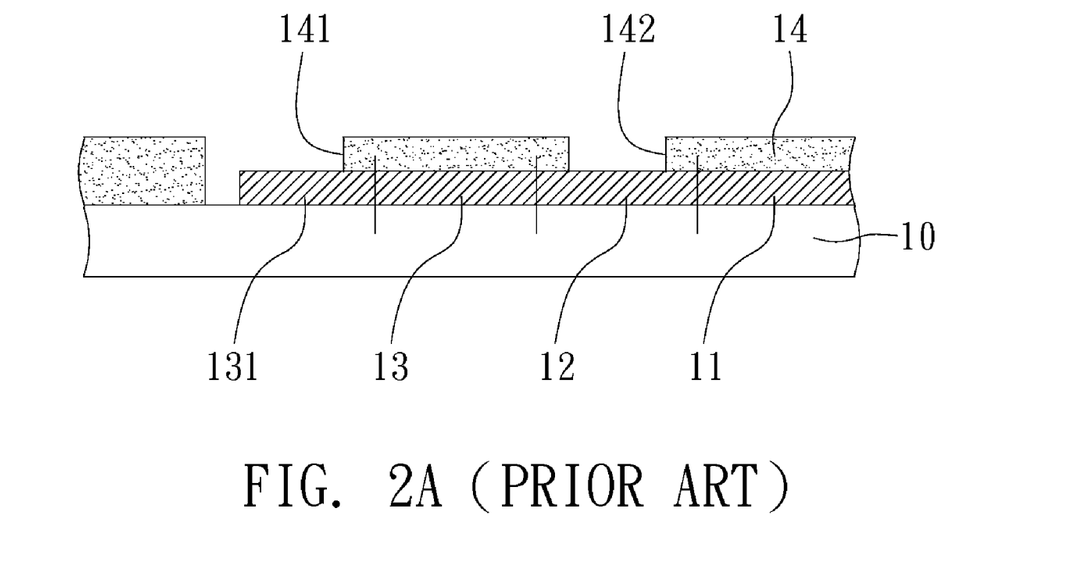
FIGS. 2A to 2E are cross-sectional diagrams showing a conventional method for severing the distributing wires between the electrically connecting pads and the electroplating conductive wire.

First, as shown in FIG. 1 and FIG. 2A, a core board 10 is provided, which has a plurality of electroplating conductive wires 11, a plurality of distributing wires 12 and a plurality of circuits 13. The distributing wires 12 electrically connect the electroplating conductive wires 11 and the circuits 13. The circuits 13 further comprise a plurality of electrically connecting pads 131. An insulating protection layer 14 is formed on the surfaces of the electroplating conductive wires 11, the distributing wires 12 and the circuits 13. The insulating protection layer 14 is formed with a plurality of first openings 141 for exposing the electrically connecting pads 131 and a plurality of second openings 142 for exposing a portion of the distributing wires 12.

Figure 2B:
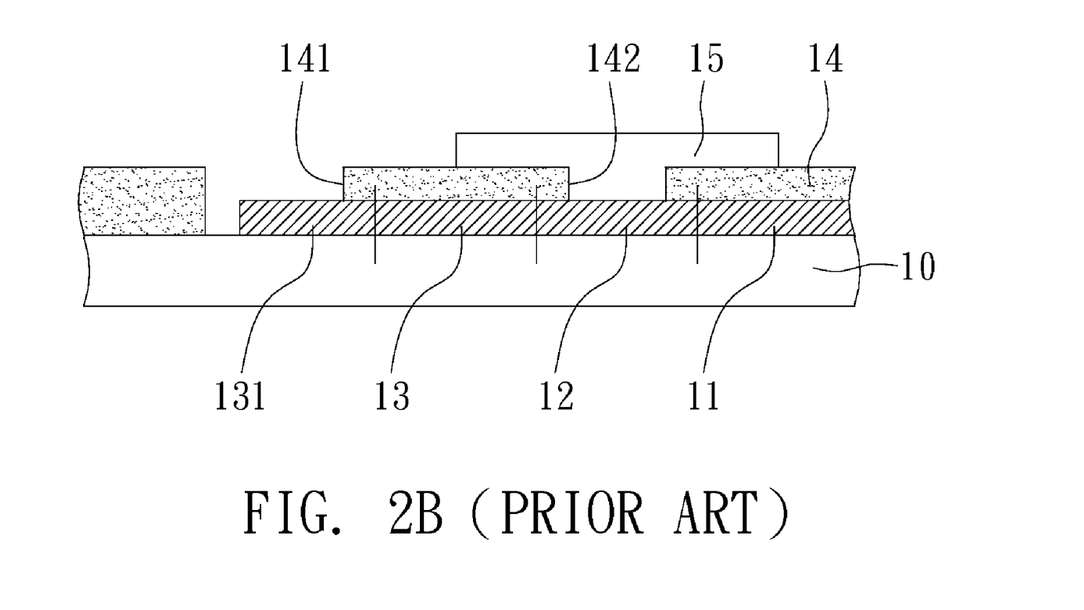

As shown in FIG. 2B, a resist layer 15 is formed on the second openings 142 in the insulating protection layer 14 to cover the distributing wires 12 but expose the electrically connecting pads 131 through the first openings 141.

Figure 2C:
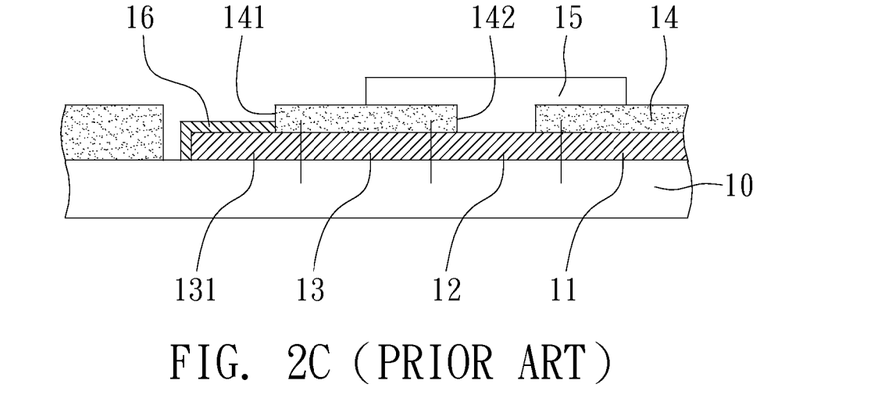

As shown in FIG. 2C, a metal protection layer 16 made of Ni/Au, for example, is formed on the surfaces of the electrically connecting pads 131 by electroplating.

Figure 2D:
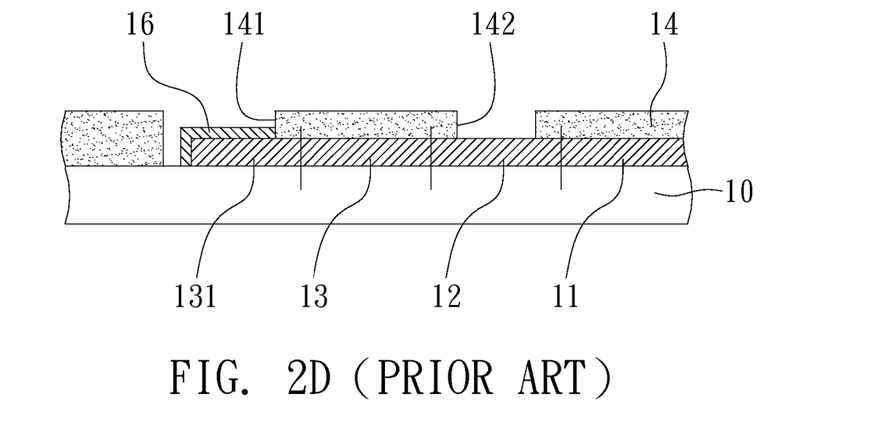

As shown in FIG. 2D, the resist layer 15 is removed so as to expose the distributing wires through the second openings 142 in the insulating protection layer 14.

Figure 2E:
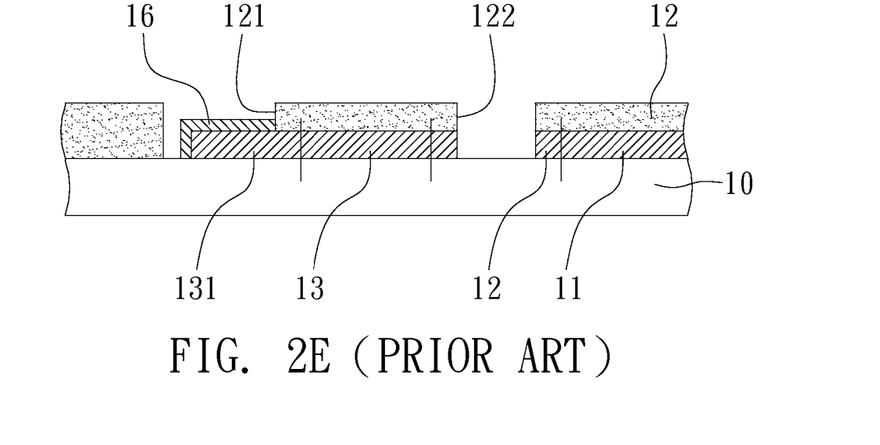

As shown in FIG. 2E, the distributing wires 12 in the second openings 142 are removed by etching so as to create a broken circuit in the distributing wires 12, and thus the circuits 13 becomes an independent circuit, thereby allowing electrical testing to be performed.

However, as the resist layer 15 has to be formed on the second openings and then be removed after the metal protection layer is formed on the surfaces of the electrically connecting pads, thus increasing the process steps and prolonging the process.

To overcome the above drawback, U.S. Pat. No. 6,660,559 discloses a process that removes a conductive wire in the absence of any resist layer, as shown in FIGS. 3A to 3C.

Figure 3A:
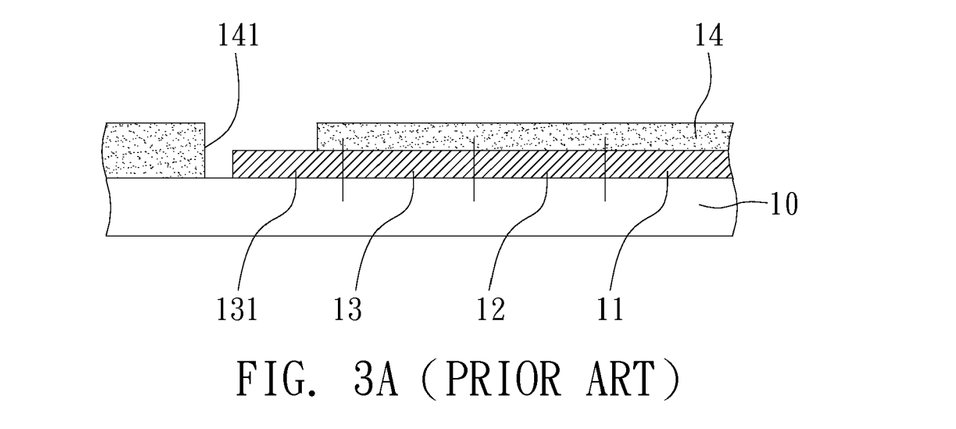
FIGS. 3A to 3C are cross-sectional diagrams showing another method for severing the distributing wires between the electrically connecting pads and the electroplating conductive wire.

As shown in FIG. 3A, a core board 10 is provided, which has a plurality of electroplating conductive wires 11, a plurality of distributing wires 12 and a plurality of circuits 13. The distributing wires 12 electrically connect the electroplating conductive wires 11 and the circuits 13. The circuits 13 have a plurality of electrically connecting pads 131. An insulating protection layer 14 is formed on the electroplating conductive wires 11, the plurality of distributing wires 12 and the circuits 13. A plurality of first openings 141 are formed in the insulating protection layer 14 to expose the electrically connecting pads 131.

Figure 3B:
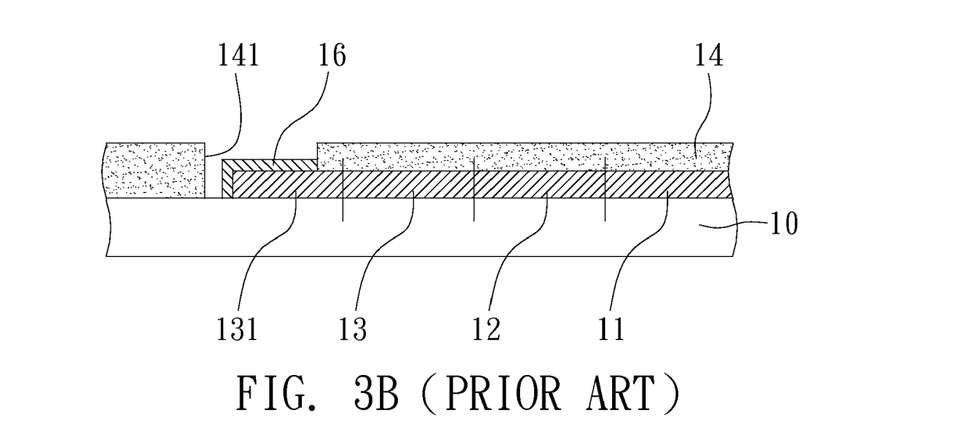

Referring to FIG. 3B, a metal protection layer 16 is formed on the surfaces of the electrically connecting pads 131 exposed from the first openings 141 in the insulating protection layer 14 by electroplating. The insulating protection layer 14 prevents the metal protection layer 16 from forming on the distributing wires 12.

Figure 3C:
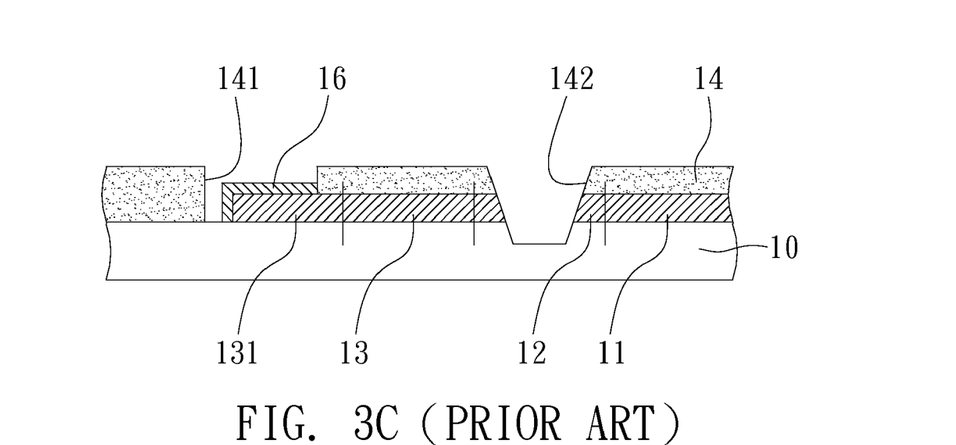

Referring to FIG. 3C, the insulating protection layer 14 is made of a material that can be melted by a laser beam. A predefined region of the insulating protection layer 14 on the distributing wires 12 is removed by a laser beam, so as to form a second opening 142 in the insulating protection layer 14. A portion of the distributing wires 12 below the insulating protection layer 14 is severed, thereby ensuring separation of the electrically connecting pads 131 and preventing short circuit from occurring.

Although the process using the laser beam can overcome the above-described drawback such as an increase of the process steps and the process time, copper residues and high-temperature carbide residues are likely to be found at the cut, and the residues tend to cause micro-short during an AEI (Auto Electrical Inspection) of a product.

Therefore, there is a need to provide a method for separating the circuit from the electroplating conductive wire in a circuit board upon fabrication of the circuit board so as to enable electrical testing, and prevent a waste of material during the fabrication process, high fabrication cost, and long fabrication time.

SUMMARY OF THE INVENTION

According to the above drawbacks, an objective of the present invention is to provide a circuit board structure for electrical testing and a fabrication method thereof, which avoids the formation of residues on the circuit board, thereby preventing micro-short from occurring during electrical testing of the circuit board structure.

Another objective of the present invention is to provide a circuit board structure for electrical testing and a fabrication method thereof, which reduces noise interference from external signal lines so as to ensure reliability of the circuit board.

In order to attain the above and other objectives, the present invention provides a circuit board for electrical testing, comprising: a core board having a plurality of first circuit, distributing wires and electroplating conductive wires formed thereon, wherein the distributing wires electrically connect the first circuits and the electroplating conductive wires; a dielectric layer formed on the surfaces of the core board, the first circuits, the distributing wires and the electroplating conductive wires, wherein the dielectric layer has at least an opening to expose the distributing wires; a plurality of second circuits formed on the surface of the dielectric layer and electrically connected to the first circuits; a solder mask layer formed on the surfaces of the dielectric layer and the second circuits; and at least a first opening formed in the solder mask layer, on top of the distributing wires, and deep into the dielectric layer, so as to create a broken circuit between the distributing wires and the electroplating conductive wires, thereby enabling electrical testing of the circuit board structure.

The first circuit and the second circuit are electrically connected together by a plated through hole (PTH) or a conductive blind via, for example. The second circuits have a plurality of electrically connecting pads, and a metal protection layer is formed on the surfaces of the electrically connecting pads. The metal protection layer is made of Pb, Sn, Ag, Cu, Au, Bi, Sb, Zn, Ni, Zr, Mg, In, Te, Ga, or an alloy thereof. A second opening is formed in the solder mask layer to expose the metal protection layer on the electrically connecting pads.

The present invention further provides a fabrication method of a circuit board structure for electrical testing, comprising: providing a core board having a plurality of first circuits, distributing wires and electroplating conductive wires formed thereon, wherein the distributing wires electrically connect the first circuits and the electroplating conductive wires; forming a dielectric layer on the surfaces of the core board, the first circuits, the distributing wires and the electroplating conductive wires, and forming at least an opening in the dielectric layer to expose the distributing wires; forming a plurality of second circuits on the surface of the dielectric layer and forming a plurality of conductive blind vias in the openings of the dielectric layer, wherein the second circuits are electrically connected to the first circuits and the conductive blind vias are electrically connected to the distributing wires; forming a solder mask layer on the surfaces of the dielectric layer and the second circuits, and forming at least a first opening in the solder mask layer to expose the conductive blind via; and removing the conductive blind via in the first opening deep in the dielectric layer so as to create a broken circuit between the distributing wires and the electroplating conductive wire, thereby enabling electrical testing of the circuit board structure.

The first circuits and the second circuits are electrically connected together by a plated through hole (PTH) or a conductive blind via, for example. The second circuits have a plurality of electrically connecting pads, and a metal protection layer is formed on the surfaces of the electrically connecting pads. A second opening is formed in the solder mask layer to expose the metal protection layer on the electrically connecting pads. The conductive blind via is removed by a chemical means, such as alkaline etching, so as to create a broken circuit in the distributing wires, thereby enabling electrical testing of the circuit board structure.

Therefore, the present invention mainly involves forming a first opening in the solder mask layer to expose the conductive blind via electrically connecting the distributing wires and removing the conductive blind via by etching so as to create a broken circuit between the distributing wires and the electroplating conductive wires, thereby enabling electrical testing of the circuit board structure, to determine whether the circuit board is a conforming product. The chemical removal method avoids the formation of residues, thus preventing the conventional micro-short from occurring during electrical testing and ensuring reliability of the result of electrical testing. In addition, since the first circuit, the distributing wires and the electroplating conductive wire are formed deep in the circuit board, noise interference is reduced.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification.

FIGS. 4A to 4H are cross-sectional diagrams showing a circuit board structure for electrical testing and fabrication method thereof.

Figure 4A:
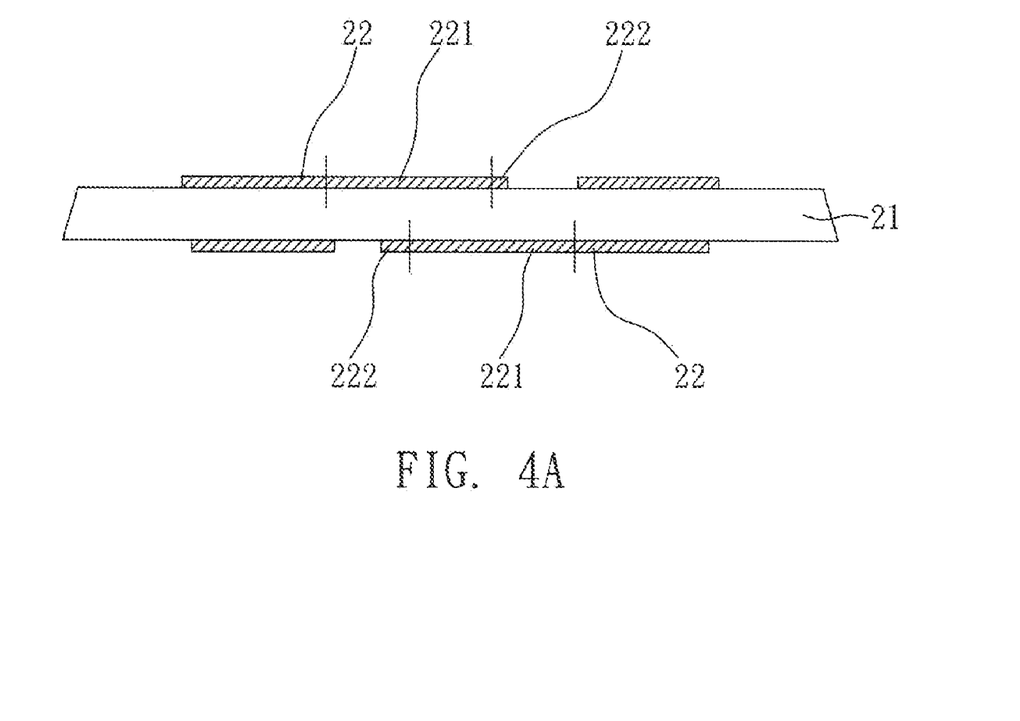
FIGS. 4A to 4H are cross-sectional diagrams showing a circuit board structure for electrical testing and fabrication method thereof according to the present invention.

Referring to FIG. 4A, a core board 21 is provided. At least one surface of the core board 21 is provided with a plurality of first circuits 22, distributing wires 221, and electroplating conductive wires 222. The distributing wires 221 electrically connect the first circuits 22 and the electroplating conductive wires 222.

Figure 4B:
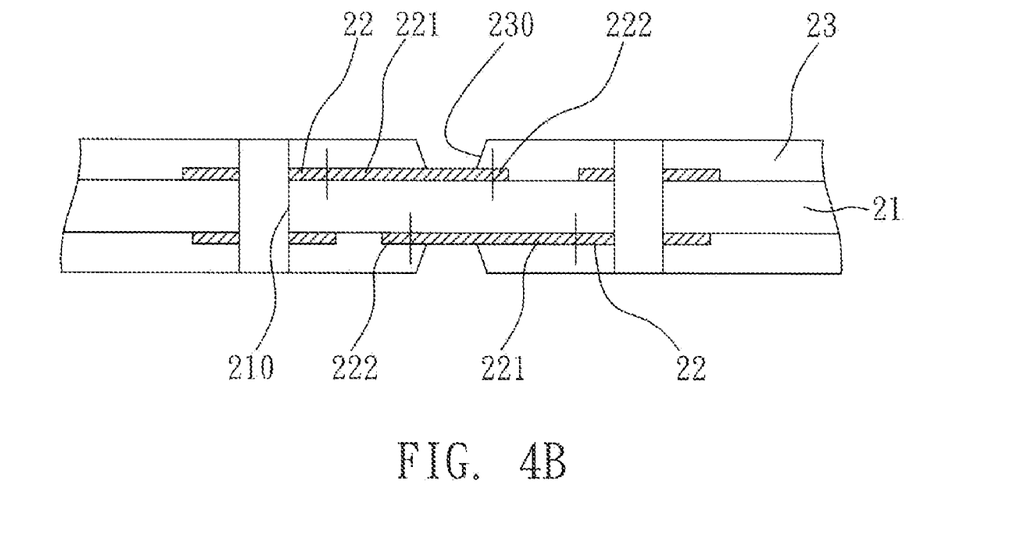

As shown in FIG. 4B, a dielectric layer 23 is formed on the surface of the core board 21. At least one through hole 210 is formed in the core board 21, the first circuit 22, and the dielectric layer 23. An opening 230 is formed in the dielectric layer 23. The opening 230 is formed above the distributing wires 221 so as to expose a portion of the distributing wires 221.

Figure 4C:
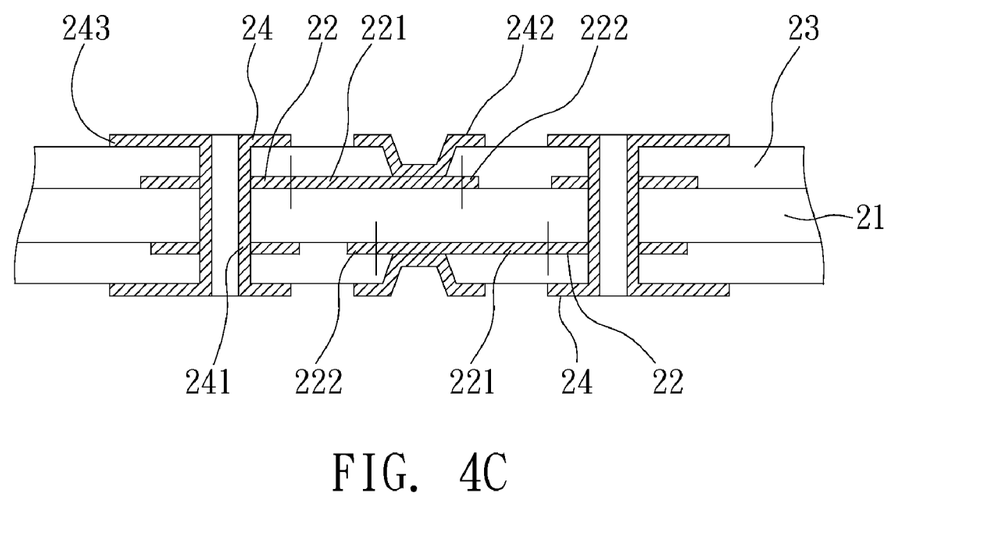

As shown in FIG. 4C, a plurality of second circuits 24 are formed on the surface of the dielectric layer 23, and a conductive structure such as a plated through hole 241 is formed in the through hole 210, such that the second circuits 24 can be electrically connected to the first circuits 22 through the plated through hole 241. A conductive blind via 242 is formed in the opening 230 and electrically connected to the distributing wires 221. The second circuits 24 have a plurality of electrically connecting pads 243 on the dielectric layer 23.

Referring to FIG. 4C', a conductive structure, such as a conductive blind via 241', may be formed in the dielectric layer 23 such that the second circuit 24 is electrically connected to the first circuit 22 via the plated through hole 241'. Also, the second circuits 24 have a plurality of electrically connecting pads 243 on the dielectric layer 23. The following preferred embodiments are exemplified by the plated through hole 241.

Figure 4D:
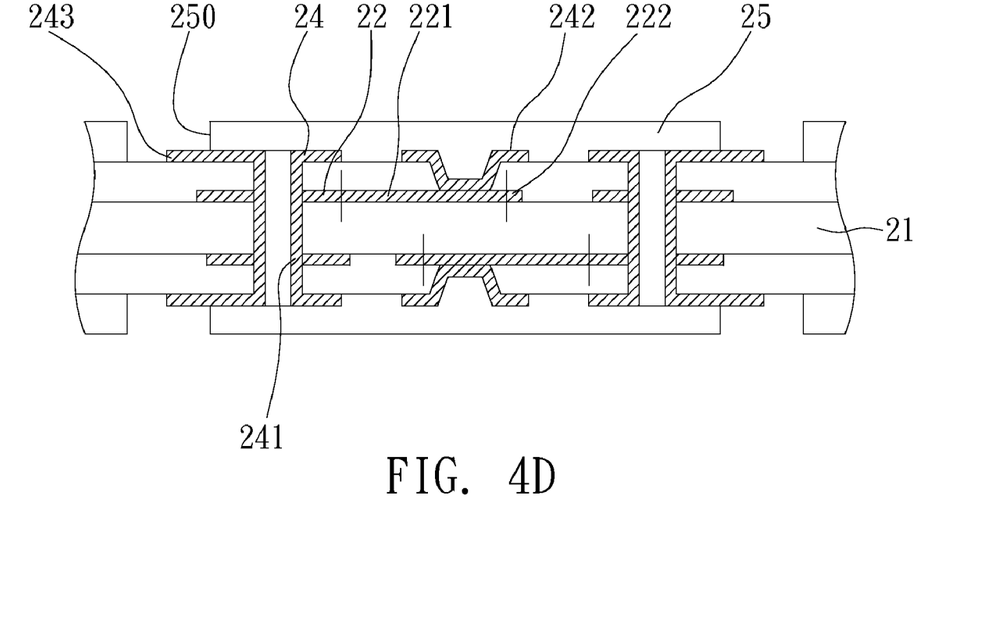

As shown in FIG. 4D, a resist layer 25 is formed on the surfaces of the dielectric layer 23 and the second circuit 24, and openings 250 are formed in the resist layer 25 to expose the electrically connecting pads 243 of the second circuits 24.

Figure 4E:
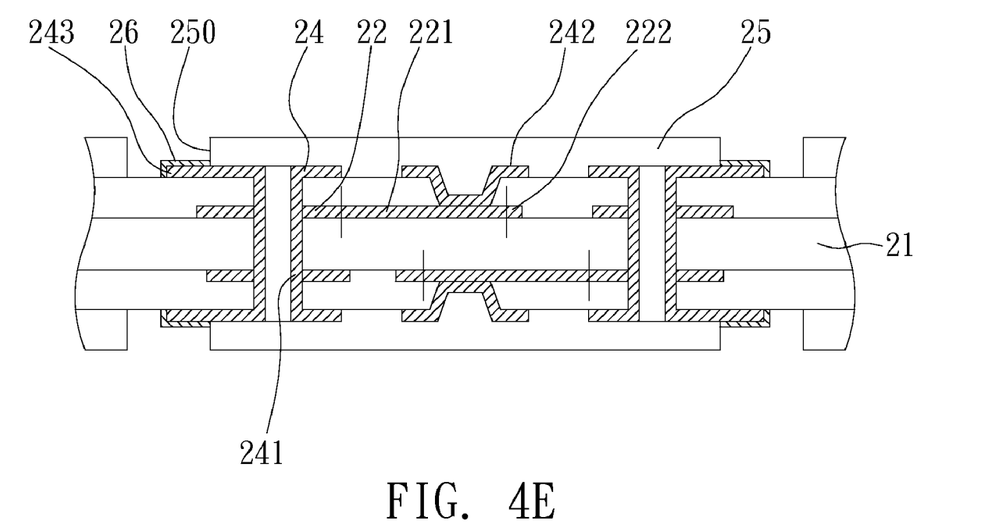

As shown in FIG. 4E, the electroplating conductive wire 222, the distributing wires 221, the first circuit 22, the plated through hole 241 and the second circuit 24 together function as an electrical conduction path for electroplating a metal protection layer 26 onto the surfaces of the electrically connecting pads 243 exposed from the openings 250. The metal protection layer 26 is made of Pb, Sn, Ag, Cu, Au, Bi, Sb, Zn, Ni, Zr, Mg, In, Te, Ga, or an alloy thereof.

Figure 4F:
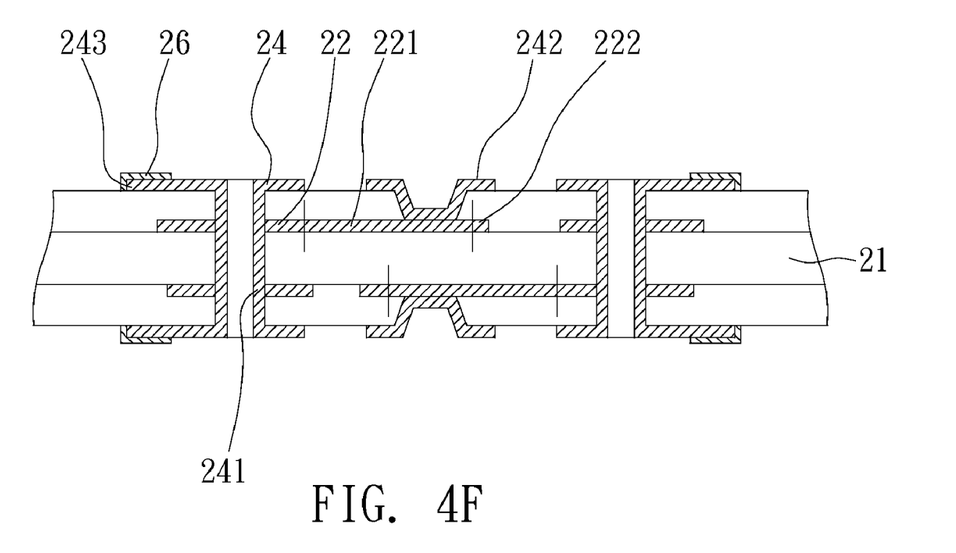

As shown in FIG. 4F, the resist layer 25 is removed by a physical or chemical means well-known in the art, and thus detailed description thereof is omitted herein.

Figure 4G:
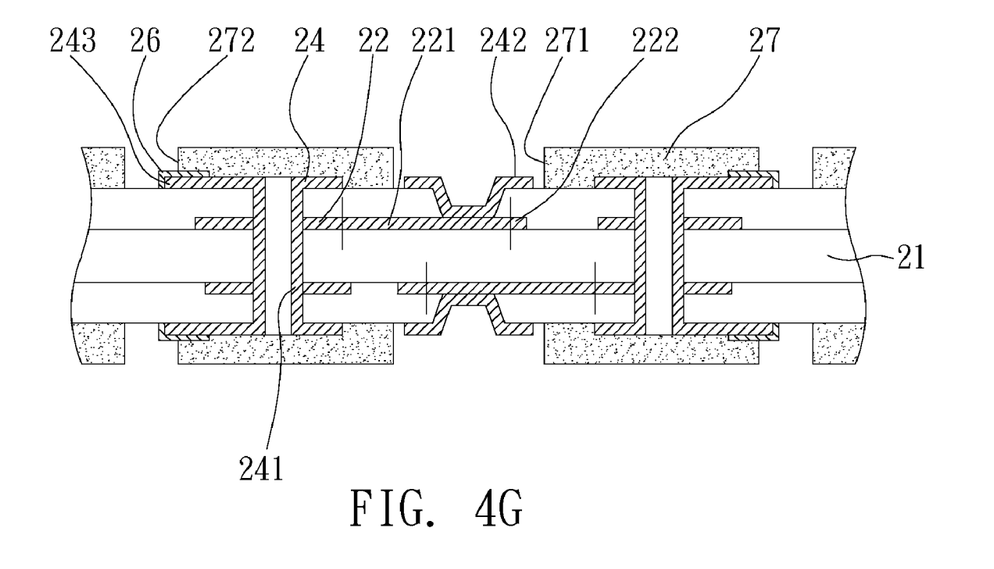

As shown in FIG. 4G, a solder mask layer 27 is formed on the surfaces of the dielectric layer 23 and the second circuits 24. At least one first opening 271 is formed in the solder mask layer 27 to expose the conductive blind via 242 electrically connected to the distributing wires 221, and a second opening 272 is formed in the solder mask layer 27 to expose the metal protection layer 26 on the surfaces of the electrically connecting pads 243.

Figure 4H:
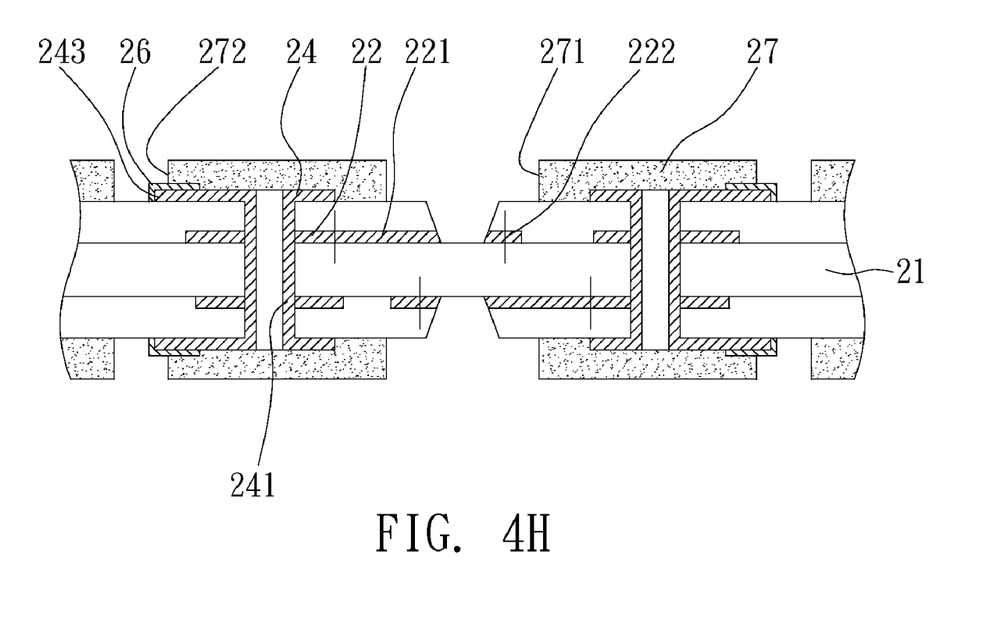
Figure 5:
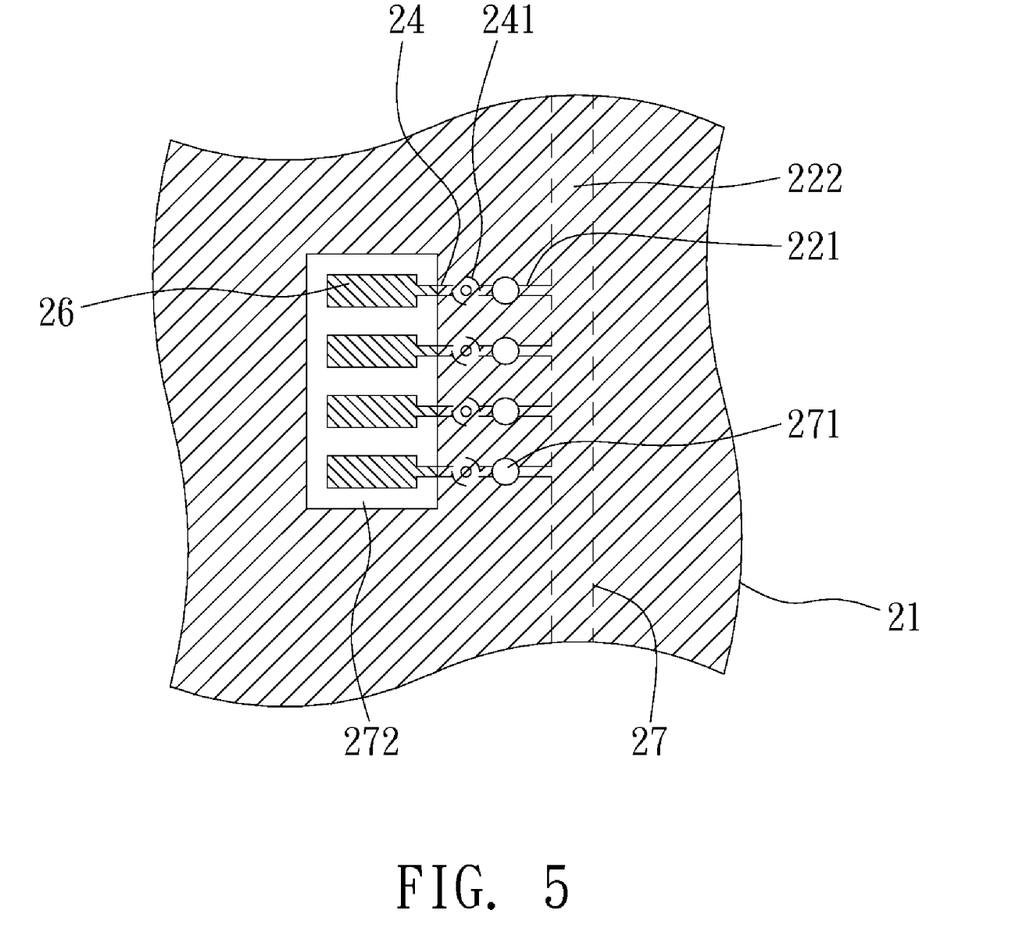
FIG. 5 is a top view of the circuit board structure for electrical testing according to the present invention.

Referring to FIG. 4H and FIG. 5, the conductive blind via 242 exposed from the first opening 271 is removed by a chemical means, such as alkaline etching, thereby creating a broken circuit between the distributing wires 221 and the electroplating conductive wire 222. Thus, electrical testing of the circuit board structure can be performed.

According to the above-described fabrication method, the present invention further provides a circuit board structure for electrical testing, comprising: a core board 21 having a plurality of first circuits 22, distributing wires 221 and electroplating conductive wires 222 formed thereon, wherein the distributing wires 221 electrically connect the first circuit 22 and the electroplating conductive wire 222; a plurality of second circuit 24 formed on the core board 21 and electrically connected to the first circuit 22; a solder mask layer 27 formed on the surfaces of the core board 21 to cover the second circuit 24; and at least one first opening 271 formed in the solder mask layer 27 and on top of the distributing wires 221, wherein a broken circuit is created between the distributing wires 221 and the electroplating conductive wire 222 by a chemical means, thereby enabling electrical testing of the circuit board structure. In general, the chemical means is a metal etching process using a chemical solution.

The above structure further comprises a conductive structure, such as a plated through hole 241 or a conductive blind via 241', for electrically connecting the firsts circuit 22 and the second circuits 24. The second circuits 24 have a plurality of electrically connecting pads 243. A metal protection layer 26 is formed on the surfaces of the electrically connecting pads 243. A second opening 272 is formed in the solder mask layer 27 to expose the metal protection layer 26 on the surfaces of the electrically connecting pads 243.

According to the present invention, a first opening is formed in the solder mask layer to expose the conductive blind via electrically connecting the distributing wires, and the conductive blind via is removed by a chemical means, so as to create a broken circuit between the distributing wires and the electroplating conductive wires, thereby enabling electrical testing of the circuit board structure. Further, formation of residues and laser-induced residues are prevented as the conductive blind via is removed by a chemical means, thereby preventing the conventional micro-short from occurring during electrical testing and accordingly ensuring reliability of the result of electrical testing. In addition, since the first circuit, the distributing wires and the electroplating conductive wire are formed deep in the circuit board, noise interference is reduced.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A circuit board structure for electrical testing, comprising:
    a core board having a plurality of first circuits, distributing wires and electroplating conductive wires formed thereon, wherein two ends of the distributing wires respectively connect the first circuits and the electroplating conductive wires;
    a dielectric layer formed on surfaces of the core board, the first circuits, the distributing wires and the electroplating conductive wires, wherein at least an opening is formed in the dielectric layer to expose the distributing wires;
    a plurality of second circuits formed on a surface of the dielectric layer and electrically connected to the first circuits;
    a solder mask layer formed on surfaces of the dielectric layer and the second circuits; and
    at least a first opening formed in the solder mask layer, on top of the distributing wires, and deep into the dielectric layer and the distributing wires, so as to create a broken circuit between the first circuits and the electroplating conductive wires, wherein the first opening is disposed above the opening formed in the dielectric layer, and the first opening has an aperture larger than that of the opening, the opening being formed in stepwise, thereby enabling electrical testing of the circuit board structure.

2. The circuit board structure of claim 1 further comprising a plurality of conductive structure electrically connecting the first circuits and the second circuits.

3. The circuit board structure of claim 2, wherein the conductive structure is one of a plated through hole and a conductive blind via.

4. The circuit board structure of claim 1, wherein the second circuits have a plurality of electrically connecting pads.

5. The circuit board structure of claim 4 further comprising a metal protection layer formed on the surfaces of the electrically connecting pads.

6. The circuit board structure of claim 5, wherein the metal protection layer is made of one selected from the group consisting of Pb, Sn, Ag, Cu, Au, Bi, Sb, Zn, Ni, Zr, Mg, In, Te, Ga, and an alloy thereof.

7. The circuit board structure of claim 5, wherein the solder mask layer further comprises a second opening for exposing the metal protection layer on the surfaces of the electrically connecting pads.

8. The circuit board structure of claim 1, wherein the broken circuit is created in the distributing wires by a chemical means.

* * * * *